(12) United States Patent
Khlat

(10) Patent No.: US 11,431,297 B2
(45) Date of Patent: Aug. 30, 2022

(54) ENVELOPE TRACKING POWER AMPLIFIER APPARATUS WITH PREDISTORTION

(71) Applicant: Qorvo US, Inc., Greensboro, NC (US)

(72) Inventor: Nadim Khlat, Cugnaux (FR)

(73) Assignee: Qorvo US, Inc., Greensboro, NC (US)

(*) Notice: Subject to any disclaimer, the term of this patent is extended or adjusted under 35 U.S.C. 154(b) by 0 days.

(21) Appl. No.: 17/175,849

(22) Filed: Feb. 15, 2021

(65) Prior Publication Data

US 2021/0281219 A1 Sep. 9, 2021

Related U.S. Application Data

(60) Provisional application No. 62/984,825, filed on Mar. 4, 2020.

(51) Int. Cl.

| | |
|---|---|
| *H03F 1/02* | (2006.01) |
| *H03F 3/24* | (2006.01) |
| *H03F 1/32* | (2006.01) |
| *H04B 1/04* | (2006.01) |
| *H04B 7/06* | (2006.01) |
| *H04L 27/36* | (2006.01) |

(52) U.S. Cl.
CPC ......... *H03F 1/0233* (2013.01); *H03F 1/3241* (2013.01); *H03F 3/245* (2013.01); *H04B 1/0475* (2013.01); *H04B 7/0617* (2013.01); *H03F 2200/105* (2013.01); *H03F 2200/451* (2013.01); *H04B 2001/045* (2013.01); *H04L 27/36* (2013.01)

(58) Field of Classification Search
CPC ...... H03F 1/0233; H03F 3/245; H03F 1/3241; H03F 2200/105; H03F 2200/451; H04B 1/0475; H04B 7/0617; H04B 2001/045; H04L 27/36

See application file for complete search history.

(56) References Cited

U.S. PATENT DOCUMENTS

| | | | |
|---|---|---|---|
| 9,634,695 B1* | 4/2017 | Subrahmaniyan Radhakrishnan | ....... H03F 3/189 |
| 10,056,922 B1* | 8/2018 | Tsvelykh | ............ H01P 1/20345 |
| 10,439,685 B2* | 10/2019 | Pehlke | ................. H04B 7/0404 |
| 2001/0004223 A1* | 6/2001 | Kim | ...................... H03F 1/3282 330/149 |
| 2006/0262884 A1* | 11/2006 | Wardrop | ............... H03J 1/0033 375/316 |
| 2009/0011704 A1* | 1/2009 | Karabinis | .......... H04B 7/18534 455/13.4 |
| 2011/0151806 A1* | 6/2011 | Kenington | ............... H01Q 3/28 455/101 |

(Continued)

*Primary Examiner* — Jean B Corrielus
(74) *Attorney, Agent, or Firm* — Withrow & Terranova, P.L.L.C.

(57) ABSTRACT

An envelope tracking (ET) power amplifier apparatus with predistortion includes an amplifier circuit configured to amplify a radio frequency (RF) signal based on an ET voltage and a tracker circuit configured to generate the ET voltage based on an ET target voltage. The amplifier circuit may introduce phase and amplitude distortions to the signal being amplified. To offset such distortions, exemplary aspects of the present disclosure add an isogain predistortion circuit in an ET integrated circuit (IC) to correct for amplitude distortions and add a phase modulation predistortion circuit to correct for phase distortions.

13 Claims, 7 Drawing Sheets

(56) References Cited

U.S. PATENT DOCUMENTS

| | | | |
|---|---|---|---|
| 2014/0341319 A1* | 11/2014 | Wimpenny | H04B 7/0413 |
| | | | 375/297 |
| 2015/0024699 A1* | 1/2015 | Muhammad | H03F 1/34 |
| | | | 455/114.3 |
| 2015/0028946 A1* | 1/2015 | Al-Qaq | H03F 3/24 |
| | | | 330/149 |
| 2017/0366226 A1* | 12/2017 | Weissman | H04L 43/16 |
| 2018/0175809 A1* | 6/2018 | Zai | H04B 1/0483 |
| 2018/0287597 A1* | 10/2018 | Poletto | H03K 17/689 |
| 2020/0243957 A1* | 7/2020 | Ueda | H01Q 1/002 |

* cited by examiner

ENVELOPE TRACKING POWER AMPLIFIER APPARATUS WITH PREDISTORTION

PRIORITY APPLICATION

The present application claims priority to U.S. Provisional Patent Application Ser. No. 62/984,825, filed Mar. 4, 2020 and entitled "DPD METHOD FOR MOBILE MILLIMETER WAVE TRANSMITTERS USING ET APPROACH," which is incorporated herein by reference in its entirety.

FIELD OF THE DISCLOSURE

The technology of the disclosure relates generally to envelope tracking (ET) power management in wireless communication devices.

BACKGROUND

Mobile communication devices have become increasingly common in current society. The prevalence of these mobile communication devices is driven in part by the many functions that are now enabled on such devices. Increased processing capabilities in such devices means that mobile communication devices have evolved from being pure communication tools into sophisticated mobile multimedia centers that enable enhanced user experiences.

The redefined user experience requires higher data rates offered by wireless communication technologies, such as long-term evolution (LTE). To achieve the higher data rates in mobile communication devices, sophisticated power amplifiers (PAs) may be employed to increase the output power of radio frequency (RF) signals (e.g., maintaining sufficient energy per bit) communicated by mobile communication devices. However, the increased output power of RF signals can lead to increased power consumption and thermal dissipation in mobile communication devices, thus compromising overall performance and user experiences.

Envelope tracking is a power management technology designed to improve efficiency levels of PAs to help reduce power consumption and thermal dissipation in mobile communication devices. As the name suggests, envelope tracking employs a system that keeps track of the amplitude envelope of the signals communicated by mobile communication devices. The envelope tracking system constantly adjusts the supply voltage applied to the PAs to ensure that the PAs are operating at a higher efficiency and under a required error vector magnitude (EVM) threshold (e.g., 17.5%) for a given instantaneous output power requirement of the RF signals. The PAs may create non-linear phase and amplitude distortions on the RF signals. As the number of PAs increases, the amount of such distortion may likewise increase.

SUMMARY

Aspects disclosed in the detailed description include an envelope tracking (ET) power amplifier apparatus with predistortion. The ET power amplifier apparatus includes an amplifier circuit configured to amplify a radio frequency (RF) signal based on an ET voltage and a tracker circuit configured to generate the ET voltage based on an ET target voltage. The amplifier circuit may introduce phase and amplitude distortions to the signal being amplified. To offset such distortions, exemplary aspects of the present disclosure add an isogain predistortion circuit in an ET integrated circuit (IC) (ETIC) to correct for amplitude distortions and add a phase modulation predistortion circuit to correct for phase distortions. Exemplary aspects of the present disclosure provide a variety of placements for the phase modulation predistortion circuit. By providing predistortion circuits, the amplifier circuit may provide a more linear gain to signals being amplified while preserving the benefits of envelope tracking particularly in a millimeter wave transmitter.

In one aspect, a transmitter apparatus is disclosed. The transmitter apparatus comprises an intermediate frequency (IF)-to-RF IC comprising an ET detector circuit configured to provide an ET signal based on an IF signal. The transmitter apparatus also comprises an ETIC. The ETIC comprises an amplitude modulation (AM)-to-AM (AMAM) predistortion circuit configured to receive the ET signal and generate a control signal for a power amplifier array. The transmitter apparatus also comprises an AM-to-phase modulation (PM) (AMPM) circuit, wherein the AMPM predistortion circuit is configured to adjust a phase of the IF signal.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure and, together with the description, serve to explain the principles of the disclosure.

DETAILED DESCRIPTION

Figure 1:
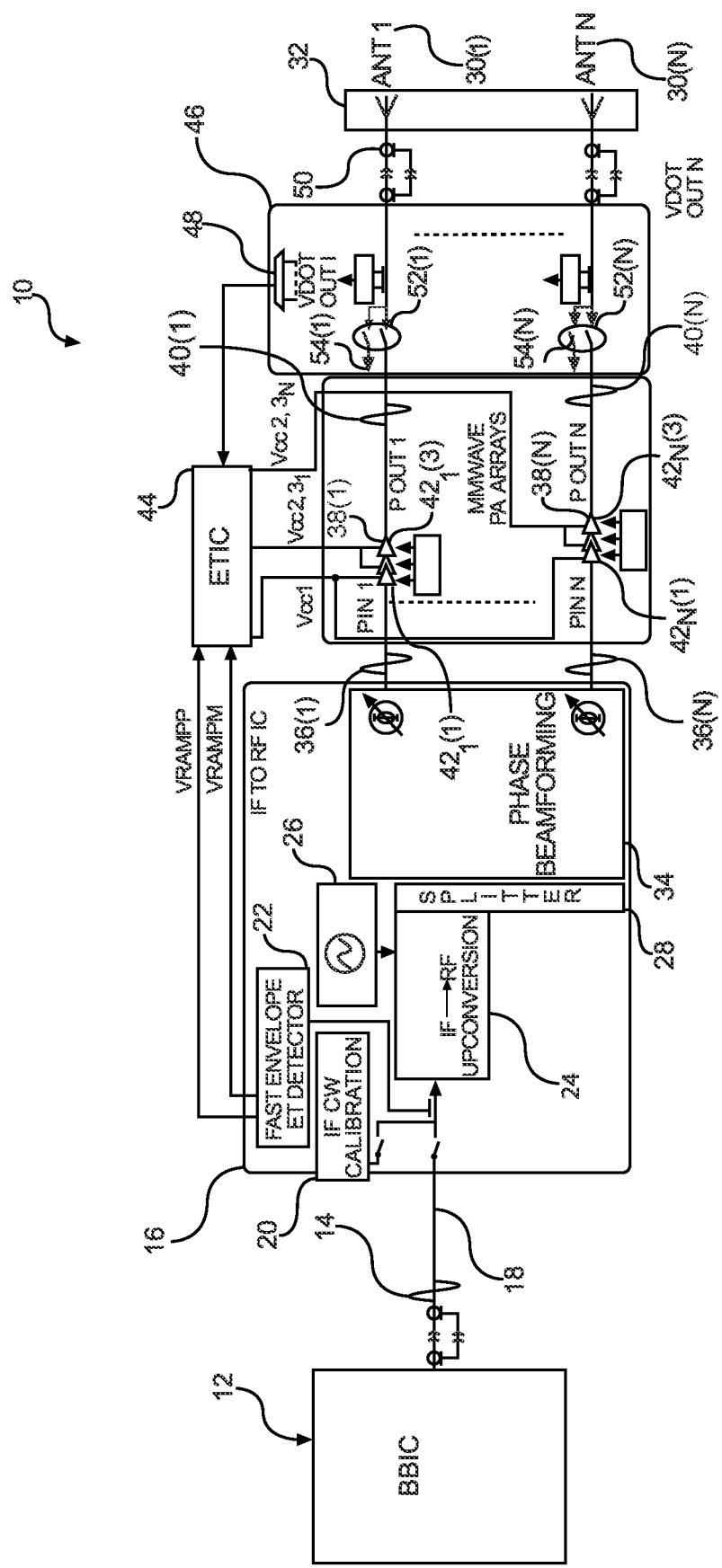
FIG. 1 is a block diagram of a conventional millimeter wave transmitter apparatus.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Aspects disclosed in the detailed description include an envelope tracking (ET) power amplifier apparatus with predistortion. The ET power amplifier apparatus includes an amplifier circuit configured to amplify a radio frequency (RF) signal based on an ET voltage and a tracker circuit configured to generate the ET voltage based on an ET target voltage. The amplifier circuit may introduce phase and amplitude distortions to the signal being amplified. To offset such distortions, exemplary aspects of the present disclosure add an isogain predistortion circuit in an ET integrated circuit (IC) (ETIC) to correct for amplitude distortions and add a phase modulation predistortion circuit to correct for phase distortions. Exemplary aspects of the present disclosure provide a variety of placements for the phase modulation predistortion circuit. By providing predistortion circuits, the amplifier circuit may provide a more linear gain to signals being amplified while preserving the benefits of envelope tracking particularly in a millimeter wave transmitter.

Figure 2:
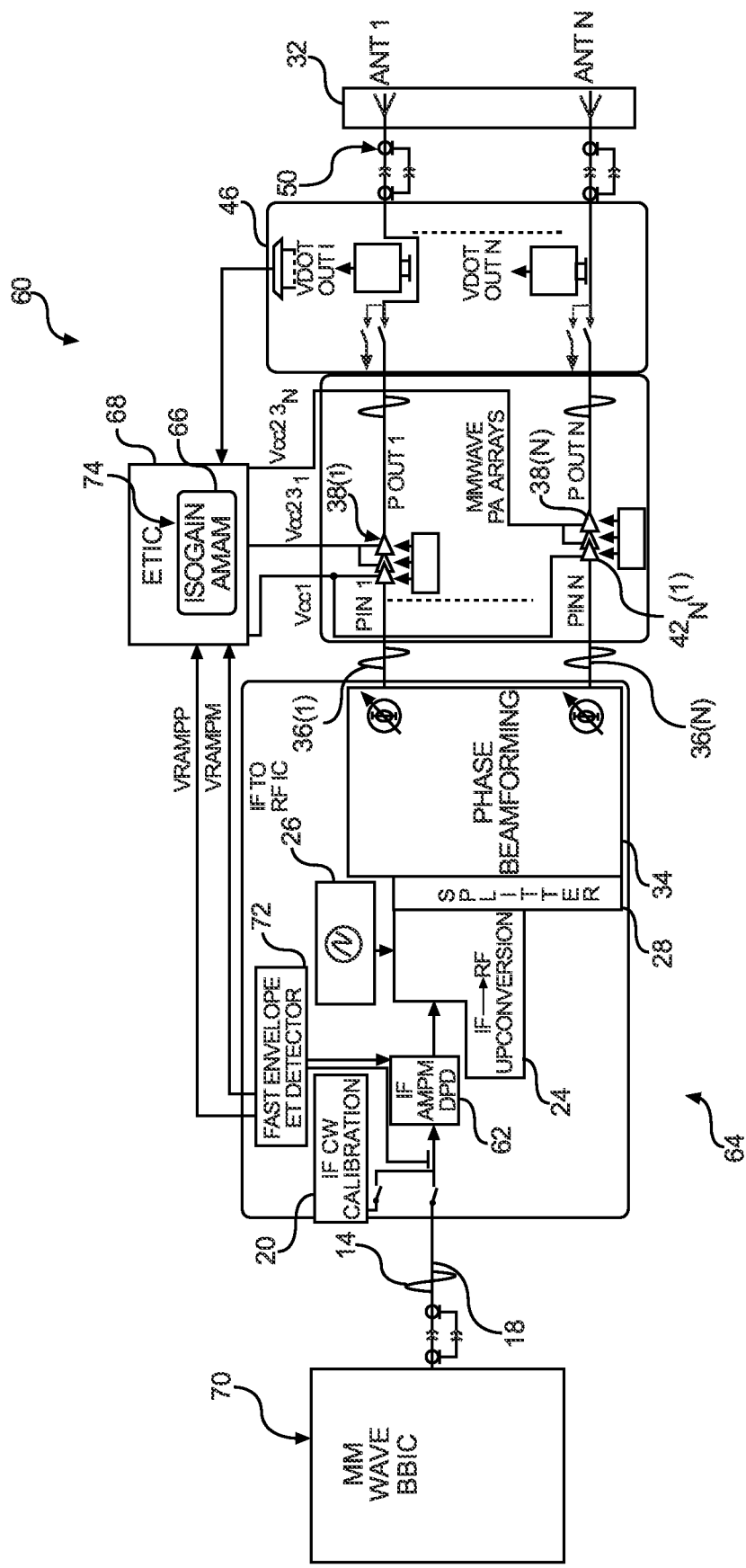
FIG. 2 is a block diagram of a millimeter wave transmitter apparatus with predistortion circuits according to a first exemplary aspect of the present disclosure.

Before discussing a millimeter wave transmitter apparatus having an ET power amplifier apparatus with predistortion according to the present disclosure, starting at FIG. 2, a brief overview of a conventional millimeter wave transmitter apparatus is first provided with reference to FIG. 1.

In this regard, FIG. 1 is a block diagram of an exemplary conventional millimeter wave transmitter apparatus 10. The millimeter wave transmitter apparatus 10 may be positioned in a wireless and/or mobile communication device such as a smart phone, tablet, cellular phone, laptop computer, or the like, and may wirelessly communicate through frequencies (e.g., ~30-300 gigahertz (GHz)) having millimeter wavelengths, such as, for example, those used in fifth-generation-new radio (5G-). Many millimeter wavelength communication protocols use beamforming through an array of antennas to help these relatively high-frequency signals reach remote locations such as a cellular tower antenna. The power required to send signals at these frequencies over relatively long distances is greater than the frequencies used in older cellular standards and accordingly, the possibility of interference is higher because of these higher power levels. To combat such interference, the power levels are tightly controlled. One such control technique is envelope tracking. Before addressing envelope tracking, more detail about signal generation is provided.

In this regard, to help enable communication, signals to be transmitted are generated in a baseband (BB) integrated circuit (IC) (BBIC) 12, which may be positioned, for example, on a printed circuit board (PCB) or backplane of the mobile communication device. The BBIC 12 may receive baseband signals such as an audio signal from a microphone (not shown) at, for example 20 hertz (Hz)-20 megahertz (MHz), and upconvert the baseband signals to an intermediate frequency (IF) signal (e.g., approximately 10 GHz) as is well understood.

With continued reference to FIG. 1, the BBIC 12 may send IF signals 14 to an IF-to-RF IC 16 through a link 18. The IF-to-RF IC 16 may be positioned on or in the chassis of the mobile communication device (e.g., on the front or right side is common). Thus, the link 18 may be a coaxial line or other flexible connection. Sending multiple IF signals in parallel would require multiple coaxial lines, which increases costs and consumes space. To avoid this increased cost and space penalty, typically only a single IF signal channel is used on the link 18. This single signal channel has ramifications as explained in greater detail below.

The IF-to-RF IC 16 includes an IF continuous wave (CW) calibration circuit 20, which is not central to the present disclosure. The IF-to-RF IC 16 also includes a fast envelope ET detector circuit 22, which detects the envelope of the IF signal 14 and provides ET signals Vrampp and Vrampm based thereon as is well understood. In an exemplary aspect, Vrampp and Vrampm are differential signal components of an underlying Vramp signal. If a single-ended signal is desired, then the underlying Vramp signal may be sent (not illustrated).

With continued reference to FIG. 1, the IF-to-RF IC 16 includes conversion circuitry 24 which may use a clock source 26 to perform upconversion from the IF to the radio frequencies used by the wireless communication protocol (e.g., 30-300 GHz). Exemplary clock sources 26 can include a local oscillator (LO), a voltage-controlled oscillator (VCO), a phase-locked loop (PLL), or the like as is well understood. The conversion circuitry 24 may further include a splitter 28, which takes the single upconverted signal and splits it into a number of signals corresponding to a number of antennas 30(1)-30(N) in an antenna array 32. The split signals are provided to a phase beamforming circuit 34, which modifies the phase of each of the split signals to form a desired beam to be sent through the antenna array 32. In particular, the phase beamforming circuit 34 generates signals 36(1)-36(N) (also referred to as Pin1-PinN in FIG. 1). As alluded to above, all the signals 36(1)-36(N) are derived from the single IF signal 14.

The signals 36(1)-36(N) are provided to respective power amplifier (PA) arrays 38(1)-38(N) to generate amplified signals 40(1)-40(N) (also referred to as Pout1-PoutN in FIG. 1). As illustrated, each PA array 38(1)-38(N) may include three PAs $42_1(1)$-$42_1(3)$ through $42_N(1)$-$42_N(3)$, although more (or two) may be present. The PA arrays 38(1)-38(N) are controlled by voltage signals $Vcc1_1$-$Vcc2,3_1$ through $Vcc1_N$-$Vcc2,3_N$. In this transmitter apparatus 10, some PAs are controlled by the same voltage signal, and thus, $Vcc2,3_X$ may control PAs $42_X(2)$ and $42_X(3)$ while PA $42_X(1)$ is controlled by $Vcc1_X$. Other control arrangements are possible, such as, for example, each PA having its own dedicated voltage signal, PAs 1 and 2 share a voltage signal, PAs 1 and 3 share a voltage signal, or the like. In some implementations, and as illustrated, $Vcc1_1=Vcc1_2=\ldots Vcc1_N$ while $Vcc2,3$ may vary depending on the needs of the beam forming.

The Vcc signals are generated by an ETIC 44 based on Vrampp and Vrampm from the fast envelope ET detector circuit 22. The amplified signals 40(1)-40(N) pass through a power detector circuit 46, which includes circuitry to detect power levels of signals on each transmission path or transmission chain and provide a feedback signal to the ETIC 44 through a multiplexer or combiner circuit 48 to assist in control of power levels. The amplified signals 40(1)-40(N) are then provided to the antenna array 32 for transmission through the antennas 30(1)-30(N). A connector 50 may be used to connect the power detector circuit 46 to the antenna array 32. The connector 50 may include plural coaxial lines or other flexible conductors to couple to the antenna array 32 as the antenna array 32 is frequently in a plane other than the plane of the chassis.

While not the focus of the present disclosure, the antenna array 32 may also receive signals, in which case switches 52(1)-52(N) and low noise amplifiers 54(1)-54(N) may be used to route the received signals to receive circuitry.

It should be appreciated that the PAs within the PA arrays 38(1)-38(N) are non-linear and may change the shape and/or phase of the signals passing through in a manner that negatively impacts performance. Envelope tracking in general may compound the complexity as envelope tracking necessarily is constantly adjusting the output power levels by adjusting the control voltages for the PAs. Since changes in the output power are non-linear with input and control voltages, constantly changing the output power levels generates more opportunities for the non-linearities to negatively impact performance. One solution would be to provide N ETICs, one for each PA array 38(1)-38(N). However, this solution consumes comparatively large amounts of power and takes up comparatively large amounts of space in the mobile communication device. Alternatively, a uniform predistortion correction could be applied across all the PA arrays. Such a uniform approach would cause one PA array to operate as desired, while the other PA arrays would be further distorted by an incorrect control signal. Such additional distortion may decrease performance and impact the user experience.

Exemplary aspects of the present disclosure add predistortion circuits to the transmitter apparatus and control the PA arrays individually without adding additional ETICs. In specific exemplary aspects, the predistortion circuits include an amplitude modulation-to-amplitude modulation (AMAM) circuit and an AM-to-phase modulation (AMPM) circuit. The AMAM circuit may be in the ETIC, and the AMPM circuit may be variously positioned as needed or desired. The AMAM circuit may use an isogain look-up table (LUT) that maps the vramp signal from the ET detector circuit to target output voltages adjusting as needed for non-linearities. The AMPM circuit may operate differently based on position as explained in greater detail below, but in general, applies a phase correction to the signal(s) to be transmitted prior to amplification to offset any phase distortion caused by the amplifier arrays.

In this regard, FIG. 2 shows a first exemplary aspect of a transmitter apparatus 60 according to the present disclosure where an AMPM circuit 62 is in an IF-to-RF IC 64. An AMAM circuit 66 is positioned within an ETIC 68. In the case of the transmitter apparatus 60, BBIC 70 is identical to the BBIC 12 of FIG. 1, producing the signal 14 on the link 18 to the IF-to-RF IC 64. Likewise, the PA arrays 38(1)-38(N), the power detector circuit 46, connector 50, and antenna array 32 are also identical between the transmitter apparatus 10 and the transmitter apparatus 60.

With continued reference to FIG. 2, the IF-to-RF IC 64 is similar to the IF-to-RF IC 16 having a CW calibration circuit 20, conversion circuitry 24, a clock source 26, splitter 28, and beamforming circuit 34. ET detector circuit 72 is similar to the ET detector circuit 22 of FIG. 1, but also provides a signal to the AMPM circuit 62 in addition to the ET signals (e.g., differential ET signals vrampp and vrampm signals) (that represent the amplitude of the IF signal) provided to the ETIC 68.

The ETIC 68 includes an isogain AMAM predistortion circuit 74 that includes a LUT. This LUT knows a priori the non-linearities of the PAs in the PA arrays 38(1)-38(N). In use, the ETIC 68 receives the vrampp and vrampm signals and from that may know an amplitude of the IF signal 14. Based on the amplitude of the IF signal 14 and the known non-linearities of the PAs, a set of Vcc signals is generated that provides a constant gain for any given input power. In an exemplary aspect, Vcc1 is shared amongst the first PAs $42_1(1)$-$42_1(N)$. That is, the driver PAs $42_1(1)$-$42_1(N)$ are used to provide the coarse gain for each of the signals 36(1)-36(N). PAs $42_2$ and PAs $42_3$ may have a shared Vcc signal. For example, PAs $42_2(1)$ and $42_3(1)$ would receive a single Vcc signal while PAs $42_2(N)$ and $42_3(N)$ would receive a single Vcc signal. This second shared Vcc signal provides the fine gain control for each signal being amplified. More detail on the ETIC 68 is provided below with reference to FIG. 7.

With continued reference to FIG. 2, in an exemplary aspect, the ET detector circuit 72 merely provides an indication about the detected amplitude of the signal, and the AMPM circuit 62 uses this amplitude to set a phase adjustment to the IF signal 14 before upconversion. This approach works because the phase distortion by any given PA array 38(1)-38(N) is relatively stable compared to the phase distortion of another given PA array within PA arrays 38(1)-38(N) regardless of minor differences in amplitude or frequency. In an alternate aspect, the ET detector circuit 72 may determine the amount of phase distortion based on the amplitude detected and provide an instruction to the AMPM circuit 62, which then performs the phase predistortion.

Figure 3:
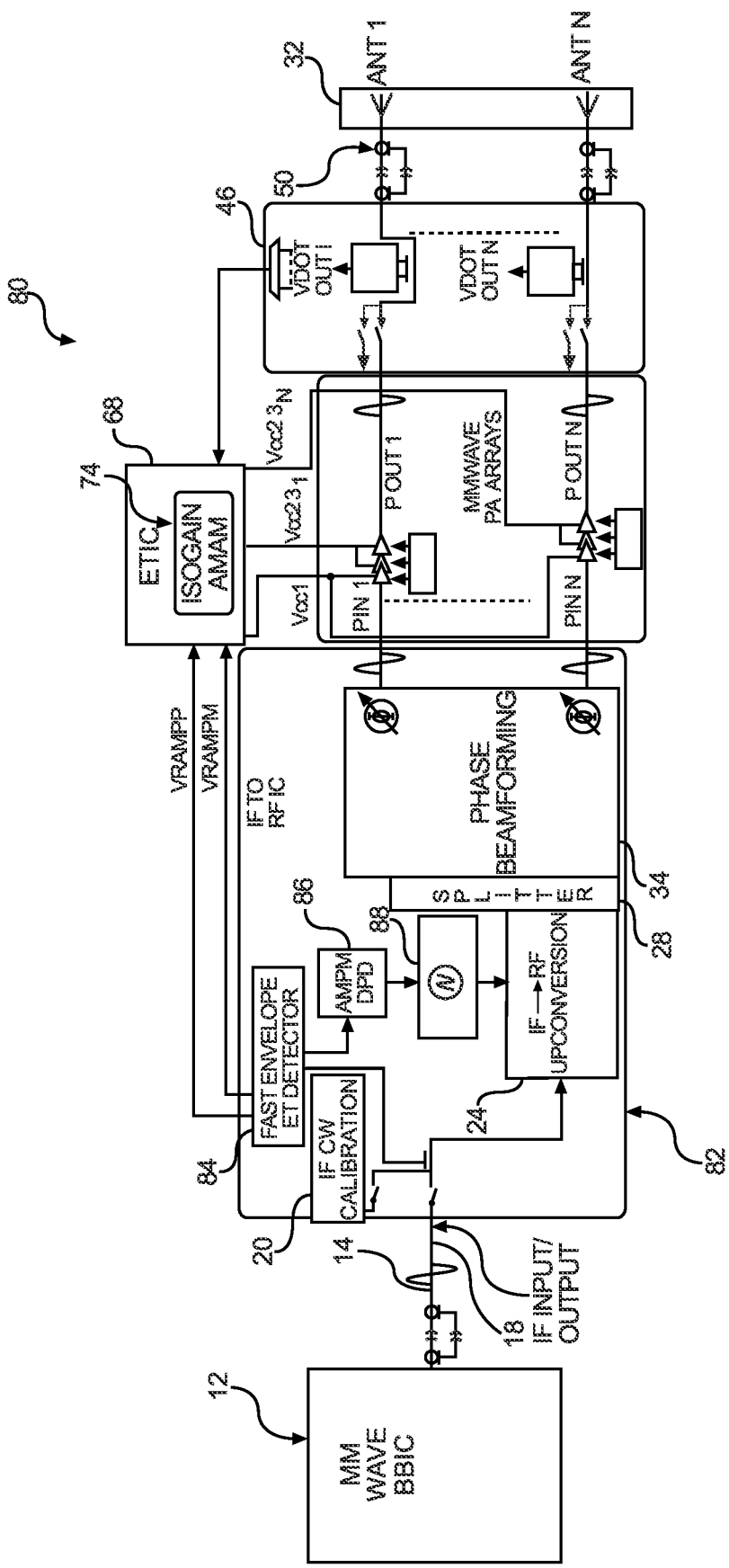
FIG. 3 is a block diagram of a millimeter wave transmitter apparatus with predistortion circuits according to a second exemplary aspect of the present disclosure.

FIG. 3 provides a similar transmitter apparatus 80 that moves the AMPM circuit to control the oscillator used to upconvert. Specifically, the transmitter apparatus 80 includes an IF-to-RF IC 82 that is similar to the IF-to-RF IC 64 of FIG. 2. However, an ET detector circuit 84 provides a signal to an AMPM circuit 86 that is not in line with the signal 14. Rather, the AMPM circuit 86 controls a phase adjustment in an oscillator 88 used to upconvert the IF signal 14 to an RF range. In other respects, the transmitter apparatus 80 operates similarly to the transmitter apparatus 60 of FIG. 2 and repeated discussion is omitted.

Figure 4:
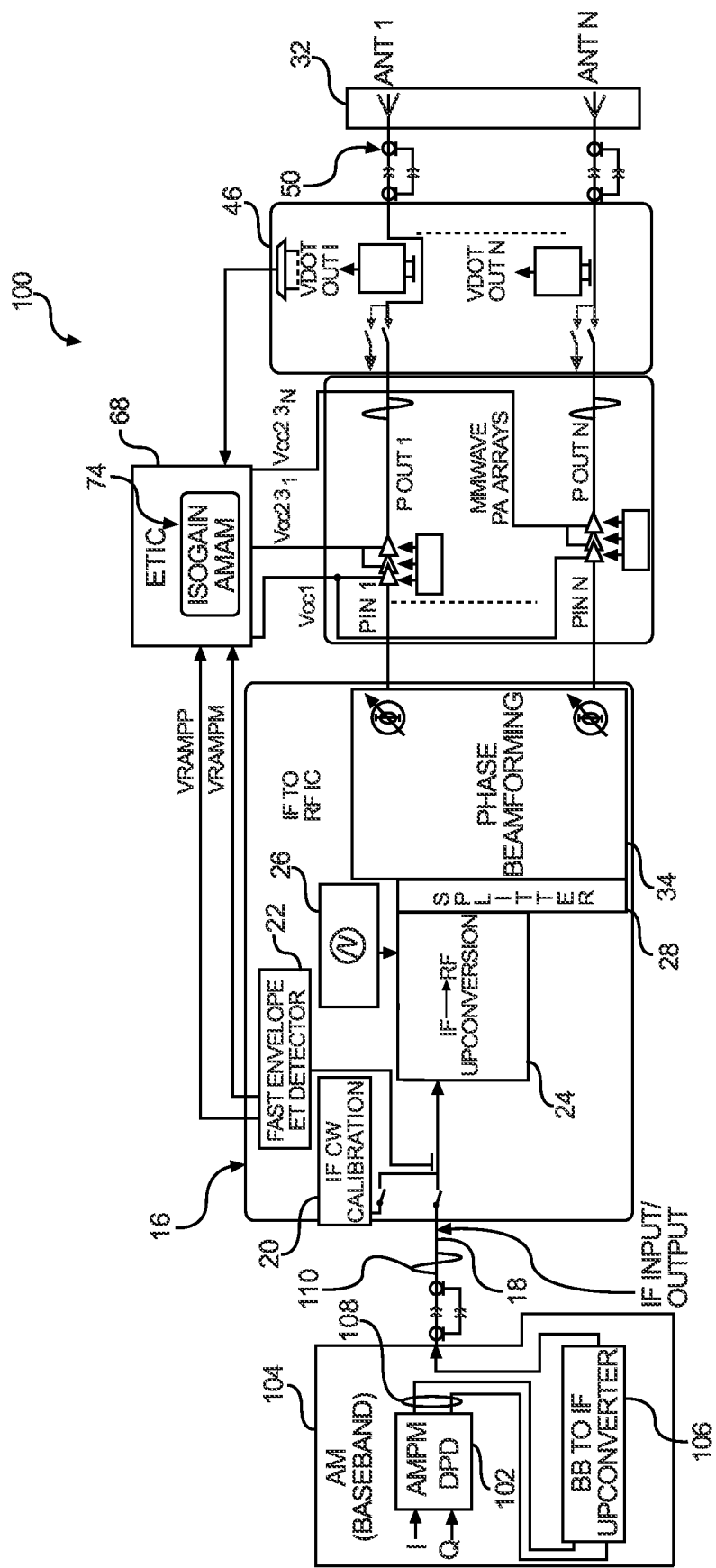
FIG. 4 is a block diagram of a millimeter wave transmitter apparatus with predistortion circuits including one predistortion circuit in a baseband circuit according to a third exemplary aspect of the present disclosure.

FIG. 4 illustrates another transmitter apparatus 100 that places an AMPM circuit 102 in a BBIC 104. The AMPM circuit 102 operates in the baseband and then an upconversion circuit 106 converts a predistorted signal 108 to an IF signal 110. The remaining portions of the transmitter apparatus 100 have already been discussed above and repeated discussion is omitted. More detail about the BBIC 104 and the AMPM circuit 102 are provided with reference to FIG. 5.

Figure 5:
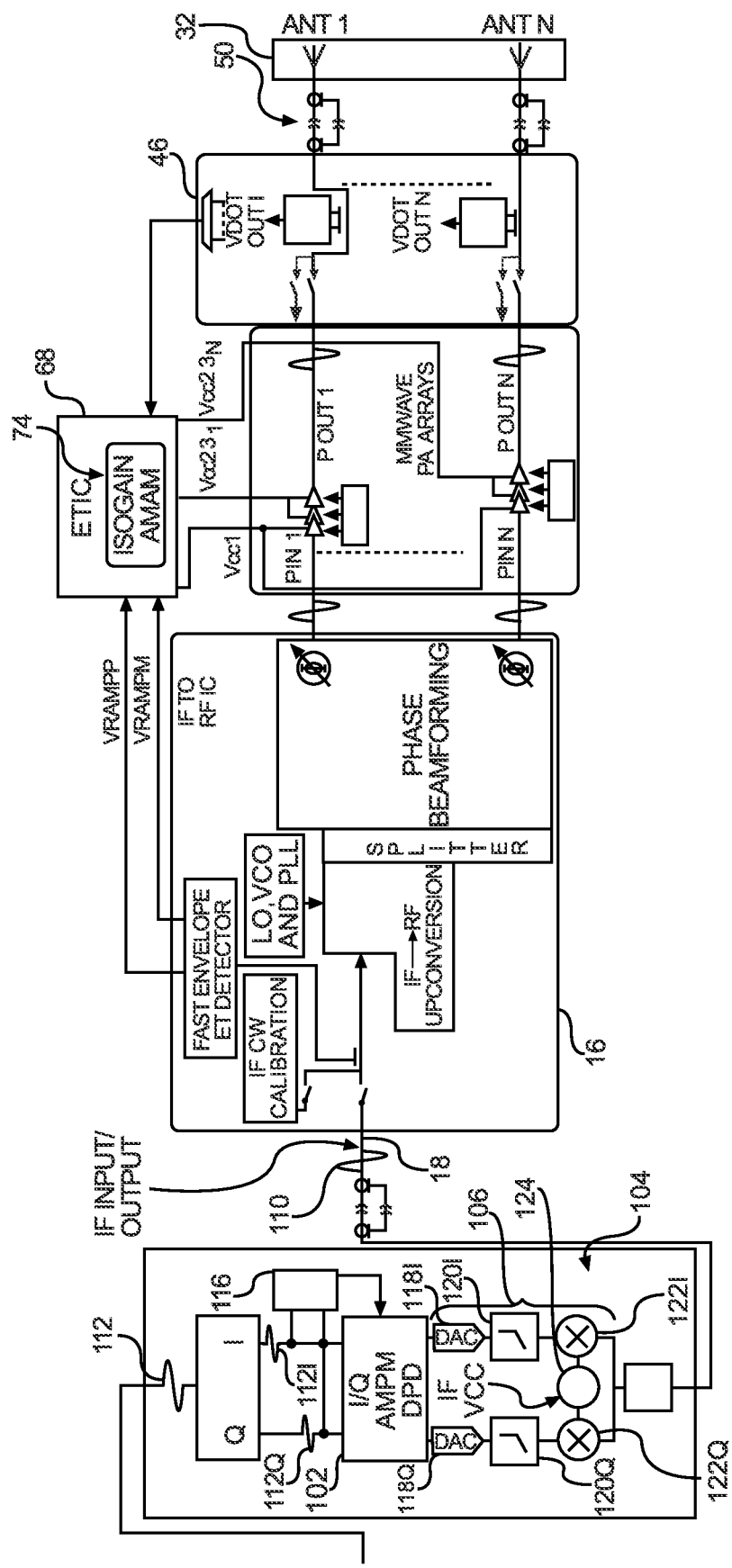
FIG. 5 is a more detailed block diagram of the baseband circuit and predistortion circuit of FIG. 4.

FIG. 5 shows a baseband signal 112 separated into in-phase (I) and quadrature phase (Q) vectors 112I, 112Q by a separation circuit 114. The magnitude of these vectors is calculated according to $\sqrt{I^2+Q^2}$ by a circuit 116 and provided to the AMPM circuit 102. Based on the magnitude, the AMPM circuit 102 applies a phase predistortion to the baseband signal 112 before passing the predistorted signal to the upconversion circuit 106. Such phase predistortion may be made by multiplying the I and Q vectors by $e^{j\phi}$ as is well understood. The upconversion circuit 106 includes digital-to-analog converters (DACs) 118I, 118Q, filters 120I, 120Q, and mixers 122I, 122Q. The mixers 122I, 122Q receive an IF signal from a clock source 124 which upconverts the signals to the IF range as is well understood. The components are combined to form a signal 110.

Figure 6:
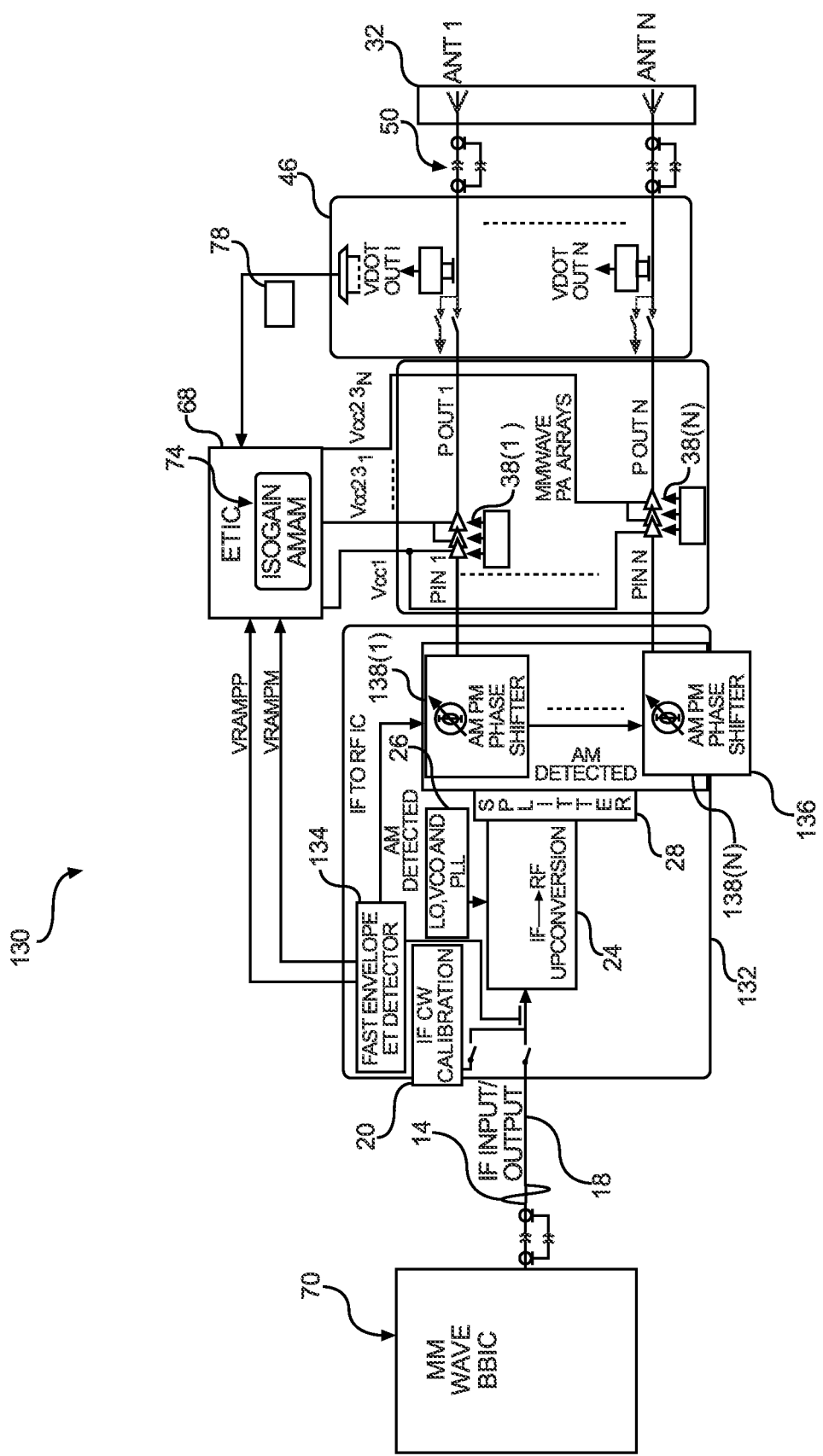
FIG. 6 is a block diagram of a millimeter wave transmitter apparatus with predistortion circuits according to a fourth exemplary aspect of the present disclosure.

FIG. 6 illustrates still another placement for the AMPM circuit. Specifically, a transmitter apparatus 130 includes an IF-to-RF IC 132 that is similar to the IF-to-RF IC 64 of FIG. 2, but instead of the ET detector circuit 72, an ET tracker circuit 134 provides a signal to a beamforming circuit 136. Within the beamforming circuit 136, individual beam circuits 138(1)-138(N) may provide a phase shift based on not just the desired beam steering algorithms, but also add a phase predistortion before passing the signals to the PA arrays 38(1)-38(N). In other respects, the transmitter apparatus 130 is similar to the transmitter apparatus 60 and repeated discussion is omitted.

Figure 7:
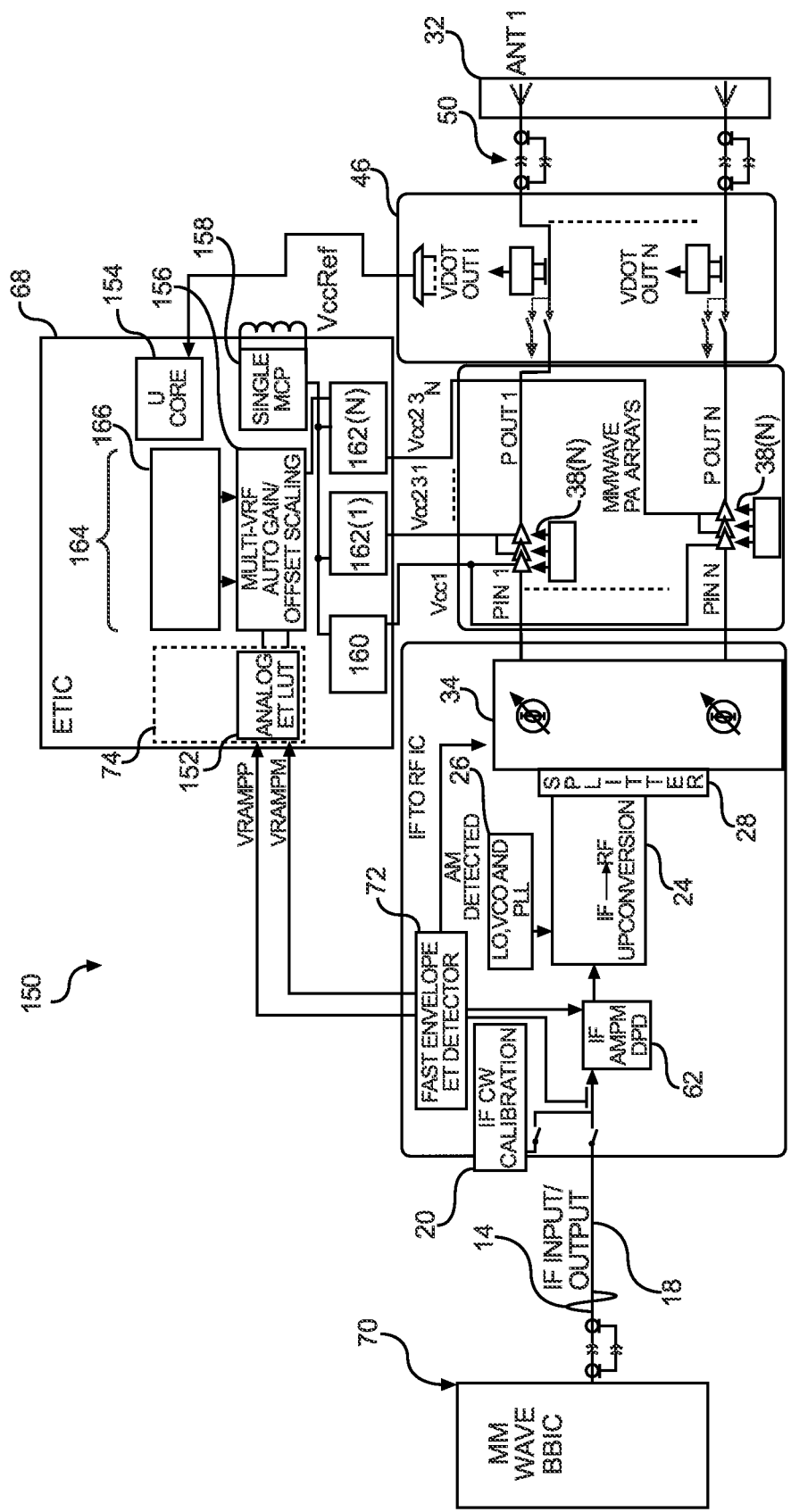
FIG. 7 is a more detailed block diagram of an envelope tracking (ET) circuit with predistortion circuit.

FIG. 7 illustrates a transmitter apparatus 150 with more detail about the ETIC 68. In particular, the ETIC 68 may include the AMAM predistortion circuit 74 that may include an analog LUT 152. The ETIC 68 may further include a micro core 154 that operates as a control circuit for the ETIC 68, a scaling circuit 156, and a switching circuit 158 that interoperates with a DC supply voltage to create a VccRef signal. The VccRef signal is supplied to amplifying circuits 160 and 162(1)-162(N). The scaling circuit 156 controls amplifiers within the amplifying circuits 160, 162(1)-162(N) to provide desired Vcc signals to the PA arrays 38(1)-38(N). As previously discussed, a single Vcc1 signal may control all first stage PAs while $Vcc_1 2,3\text{-}Vcc_N 2,3$ may be individually formed by respective amplifying circuits 162(1)-162(N). The scaling circuit 156 receives sensed current values and sensed voltage values (noted generally at 164) from the power detector circuit 46 through a circuit 166 which detects for gain/offset to do auto-scaling to achieve a desired voltage standing wave ratio (VSWR). This feedback is used by the scaling circuit 156 to help control the envelope shaping.

In use, the differential Vrampm and Vrampp signals are received by the LUT 152, which provides a corresponding Vcc to get to a target voltage for the PA arrays 38(1)-38(N). As each PA array 38(1)-38(N) may face a different impedance through the respective antennas, the LUT 152 also performs AMAM predistortion by modifying the Vcc signal. In an exemplary aspect, there may N LUTs (not shown), one for each PA array 38(1)-38(N).

By providing AMAM predistortion and AMPM distortion from a single IF signal, the multiple millimeter wave RF signals may be amplified with constant gain providing better adherence to relevant cellular transmission standards and improving performance while preserving the power savings provided by envelope tracking.

Note that while the present disclosure focuses on millimeter wavelengths, the present disclosure is not so limited. Beamforming and the concurrent transmission chains having PA arrays may be used in other frequency ranges including microwave frequencies (e.g., 3-30 GHz) or the like.

Those skilled in the art will recognize improvements and modifications to the embodiments of the present disclosure. All such improvements and modifications are considered within the scope of the concepts disclosed herein and the claims that follow.

What is claimed is:

1. A transmitter apparatus comprising:
   an intermediate frequency (IF)-to-radio frequency (RF) integrated circuit (IC) comprising:
      a clock source;
      an upconversion circuit coupled to the clock source, the upconversion circuit configured to use a signal from the clock source to upconvert an IF signal to an RF signal;
      an envelope tracking (ET) detector circuit configured to provide an ET signal based on the IF signal;
      a splitter configured to split the RF signal into a plurality of RF signals; and
      a beamforming circuit configured to adjust phases on the plurality of RF signals;
   an ET integrated circuit (ETIC) comprising:
      an amplitude modulation (AM)-to-AM (AMAM) predistortion circuit configured to receive the ET signal and generate a control signal for a power amplifier array; and
      an AM-to-phase modulation (PM) (AMPM) predistortion circuit, wherein the AMPM predistortion circuit is configured to adjust a phase of the IF signal based on the ET signal.

2. The transmitter apparatus of claim 1, wherein the ET signal comprises a differential signal.

3. The transmitter apparatus of claim 1, wherein the IF-to-RF IC further comprises the AMPM predistortion circuit.

4. The transmitter apparatus of claim 3, wherein the AMPM predistortion circuit is coupled to the clock source.

5. The transmitter apparatus of claim 1, wherein the beamforming circuit comprises the AMPM predistortion circuit.

6. The transmitter apparatus of claim 1, further comprising a baseband (BB) IC (BBIC) configured to output the IF signal.

7. The transmitter apparatus of claim 6, wherein the AMPM predistortion circuit is positioned in the BBIC.

8. The transmitter apparatus of claim 1, further comprising the power amplifier array.

9. The transmitter apparatus of claim 1, wherein the AMAM predistortion circuit comprises a look-up table (LUT).

10. The transmitter apparatus of claim 9, wherein the LUT comprises an analog LUT.

11. The transmitter apparatus of claim 9, wherein the LUT comprises a plurality of analog LUTs.

12. The transmitter apparatus of claim 11, wherein each of the plurality of analog LUTs is configured to provide a respective control voltage for a power amplifier within the power amplifier array.

13. The transmitter apparatus of claim 9, wherein the LUT is configured to take an IF envelope and generate the control signal for an isogain operation.

* * * * *